United States Patent [19]
Scholz et al.

[11] Patent Number: 5,357,130
[45] Date of Patent: Oct. 18, 1994

[54] LOW-NOISE CRYOGENIC MOSFET

[75] Inventors: Frank J. Scholz, San Diego; James W. Roach, La Mesa; Wing Y. Lum, San Diego, all of Calif.

[73] Assignee: Hughes Aircraft Company, Los Angeles, Calif.

[21] Appl. No.: 919,641

[22] Filed: Jul. 24, 1992

[51] Int. Cl.[5] ............... H01L 27/01; H01L 29/167
[52] U.S. Cl. ................... 257/288; 257/607; 257/610; 257/612
[58] Field of Search ............ 257/607, 610, 612, 288

[56] References Cited

PUBLICATIONS

Stuart Tewksbury et al., "Strong Carier Freezeout Above 77K in Tellurium-Doped Buried-Channel MOS Transistors," *IEEE Trans. on Electron Devices*, vol. ED-32, No. 1, pp. 67-69 (1985).

F. Scholz et al., "Low Frequency Noise and DLTS As Semiconductor Device Characterization Tools," *Solid State Electronics*, vol. 31, No. 2, pp. 205-217 (1988).

F. Scholz et al., "Low Frequency Noise as a Process Development and Characterization Tool," *Electrochemical Society Proc.*, pp. 240-263 (1988).

David C. Murray et al., "Shallow Defects Responsible for GR Noise in MOSFET's," *IEEE Trans. on Electron Devices*, vol. 38, No. 2, pp. 407-416 (Feb. 1991).

*Primary Examiner*—Mark V. Prenty
*Attorney, Agent, or Firm*—W. C. Schubert; W. K. Denson-Low

[57] ABSTRACT

A microelectronic device of the MOSFET type (20) is structured to exhibit low noise characteristics at cryogenic temperatures of less than about 40K. The device (20) comprises a doped silicon substrate wafer (22), the dopant having an ionization energy in the substrate of more than about 0.1 eV. Preferred substrate dopants include tellurium as an n-type dopant and indium as a p-type dopant. A metal-oxide-semiconductor field effect transistor (20) in the substrate wafer (22) includes a source (24), a drain (26), and a gate (30) intermediate the source (24) and the drain (26).

20 Claims, 4 Drawing Sheets

LOW-NOISE CRYOGENIC MOSFET

BACKGROUND OF THE INVENTION

This invention relates to microelectronic devices, and, more particularly, to the structure and use of a metal-oxide-semiconductor field effect transistor having low noise at temperatures below about 40K.

Microelectronic devices are electrical components and circuits of very small size that are fabricated in a generally planar fashion in a semiconductor substrate. Circuit elements are fabricated on the substrate, and are joined to other circuit elements by external leads. Such devices are widely used in civilian and military applications because of their small size, low weight, and high speed of operation.

One application of microelectronic devices is processing the outputs of sensors such as an infrared ("IR") sensor array. The infrared sensor array contains sensor elements that are responsive to energy radiated in the infrared range. The output of the sensor elements must be amplified and processed, eventually leading to an infrared image of the field of view of the sensor array. There are typically hundreds to hundreds of thousands of sensor elements in the sensor array, each of whose outputs is individually processed and then combined in the final image.

The infrared sensor typically operates at a very low, cryogenic temperature of less than 20K. ("K" refers to degrees Kelvin, which is measured from absolute zero.) This low sensor temperature increases the sensitivity of the sensor to infrared radiation and allows weaker infrared sources to be measured or detected. It is desirable to conduct at least a portion of the electronic processing of the output of the sensor elements in a readout circuit at a location immediately adjacent to the sensor elements, and typically in an electronic package that is integral with the sensor array.

The electronic amplifying and processing is circuitry therefore constructed of microelectronic devices that also operate at the very low temperatures at which the sensor operates. At the present time, the only suitable semiconductor device technology that can operate at such low temperatures is the metal-oxide-semiconductor field effect transistor (widely known as a MOSFET). Conventional MOSFETs introduce an undesirable deionization noise component to the signal at these low temperatures. The noise component limits the signal-to-noise ratio of the readout signal. This deionization noise has been observed to be particularly troublesome for MOSFETs operated at less than 40K.

In the past, the problem of the inherent noise introduced by the MOSFET has been observed. However, its mechanism has not been well understood, and there has been no approach to removing the noise. There is therefore a need for an improved approach to reducing the inherent input referred noise of MOSFET-type microelectronic devices that must be operated at temperatures of less than about 40K. The present invention fulfills this need, and further provides related advantages.

SUMMARY OF THE INVENTION

The present invention provides a microelectronic device having a significantly reduced input referred noise as compared with conventional MOSFETs when operated at temperatures of less than about 40K. The MOSFET-type device is no more complex to produce and no more costly than prior devices of the same general type. The microelectronic device of the invention can be used as a direct substitute for prior devices of the same general type.

In accordance with the invention, a microelectronic device comprises a silicon substrate wafer doped with an element having an ionization energy in the substrate of more than about 0.1 eV. The substrate contains no contaminant element having an ionization energy of less than about 0.1 eV in the substrate present a sufficient concentration to exhibit a noise peak below about 40K. Preferably, any such contaminant is present in a concentration of less than about $10^{12}$ per cubic centimeter. The preferred dopants for the substrate wafer include indium and tellurium. A metal-oxide-semiconductor field effect transistor (MOSFET) is deposited in the substrate wafer. The MOSFET includes a source, a drain, and a gate between the source and the drain. The microelectronic device may be used over a wide range of temperatures, but has particularly useful low-noise characteristics when operated at a temperature of less than about 40K.

The conventional dopants for the substrate are elements such as arsenic, phosphorus, or boron. The use of these dopants, each having an ion ionization energy in silicon of about 0.045 eV (electron volts), results in a high level of deionization noise at temperatures below 40K., over all conventional signal frequencies. The inventors have discovered that the use of substrate dopants with ionization energies greater than about 0.1 eV shifts the lowest-temperature deionization noise to temperatures above about 40K. for all conventional signal frequencies. The result is a low-noise MOSFET device when the device is used at temperatures of less than about 40K. This approach has been tested, and found to reduce the noise of the MOSFET output signal at temperatures below 40K. and at frequencies of 10 Hz (Hertz) to 10 KHz (KiloHertz), a range of interest in many applications.

The present invention therefore provides an important advance in the art of MOSFET-type semiconductor devices. Deionization noise is shifted from the temperature and frequency range of interest by altering the substrate dopant in high purity substrates. The device is otherwise basically unchanged. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE INVENTION

Figure 1:
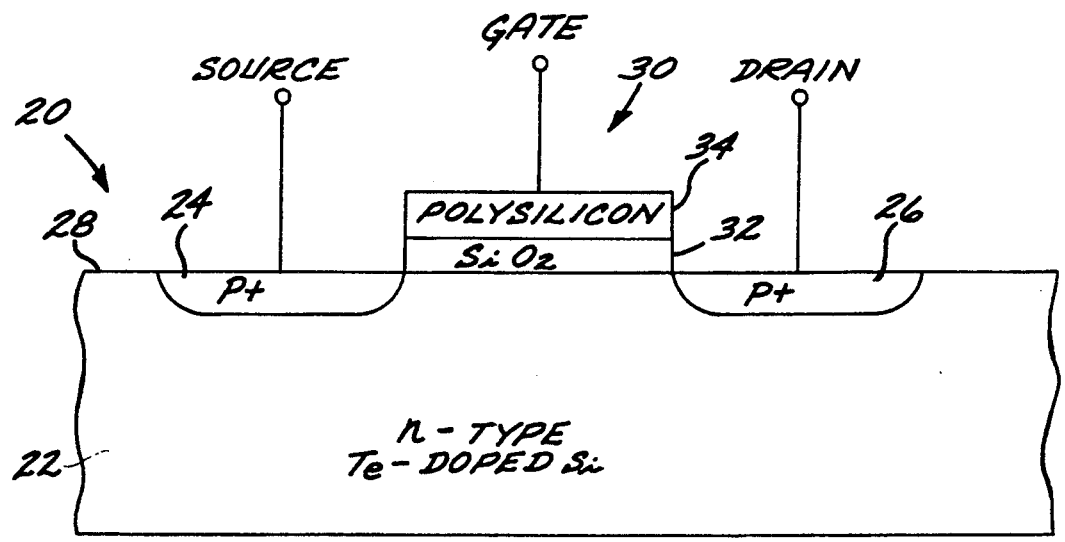
FIG. 1 is a schematic side sectional view of a MOSFET having a substrate doped with an n-type dopant.
Figure 2:
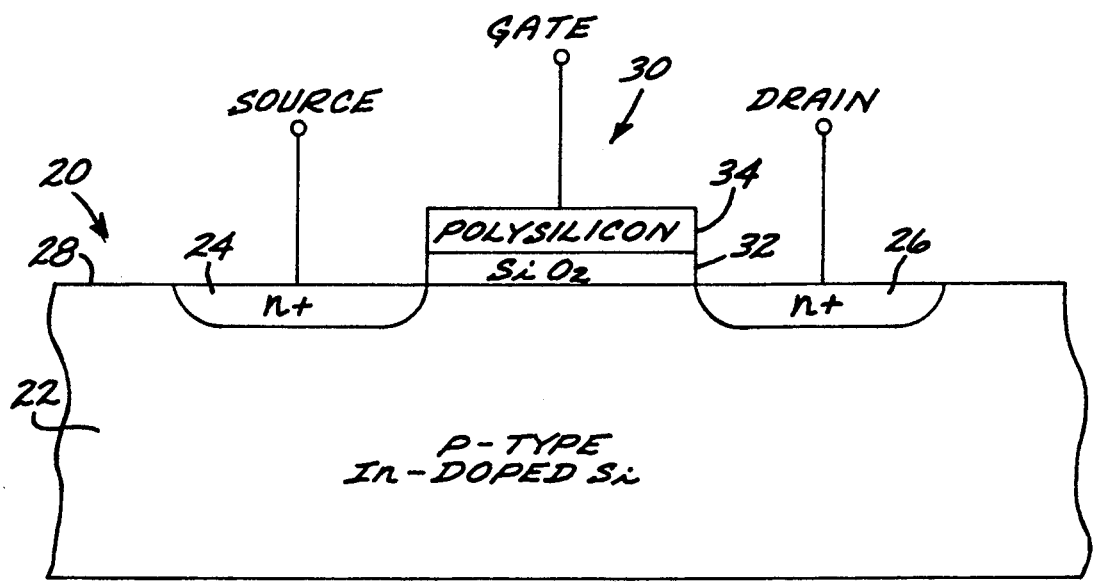
FIG. 2 is a schematic side sectional view of a MOSFET having a substrate doped with a p-type dopant.

FIGS. 1 and 2 schematically illustrate the structure of a metal-oxide-semiconductor field-effect transistor (MOSFET) 20. The MOSFET 20 includes a doped-silicon (Si), single-crystal substrate 22. A source 24 and a drain 26 are implanted at a surface 28 of the substrate 22. If the substrate dopant is n-type, the source and the drain are doped with a p-type dopant such as boron. If the substrate dopant is p-type, the source and the drain are doped with an n-type dopant such as phosphorus.

Intermediate the source 24 and the drain 26 is a gate 30 deposited upon the surface of the substrate 22. The gate structure may vary, but the gate 30 is preferably formed as a thin layer 32, about 200 Angstroms thick, of a dielectric such as silicon dioxide on the surface 28, and a conducting layer 34 of polysilicon overlying the silicon dioxide layer 32. Electrical connections are shown schematically in the figures, but are typically made by metallizing the source 24, drain 26, and gate 30, and then attaching external leads or traces to the metallization. The structures shown in FIGS. 1 and 2 are but one type of MOSFET, and others exist as well.

Techniques for preparing such MOSFETs are well known in the art. First, a silicon wafer with a dopant is prepared. In the present case, a thin wafer of intrinsic undoped silicon is implanted with the substrate dopant, and heated to permit the dopant to diffuse throughout the substrate 22. The resulting structure has a low-resistance substrate with a high-resistance thin top epitaxial layer.

The source 24 and the drain 26 are formed by ion implanting elements through a mask into the regions that define the source and drain using a conventional self-aligned gate process. The source, drain, and gate are metallized, and leads are connected.

The present invention is concerned with the substrate doping element. The dopant is an element whose ionization energy in silicon is greater than about 0.1 eV. It has been the conventional practice in the art to use phosphorus or arsenic as the n-type dopant and boron as the p-type dopant in MOSFETs to be used at temperatures below about 40K. Each of these dopant elements has an ionization energy in silicon of about 0.04–0.05 eV. Studies leading to the present invention have demonstrated that the input referred noise of the MOSFET below about 4K. is due in great part to deionization effects associated with these substrate dopants.

Figure 3:
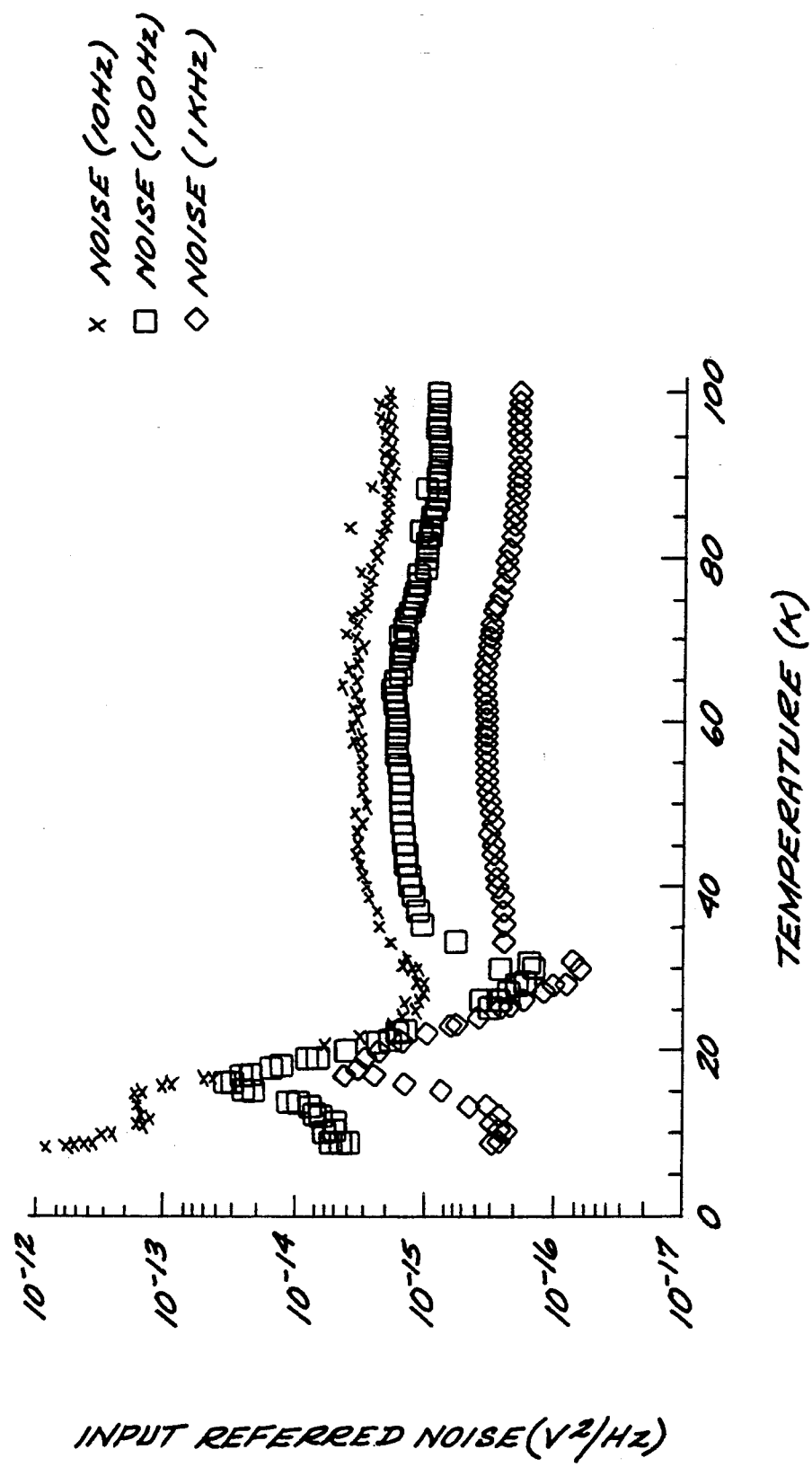
FIG. 3 is a graph of input referred spot frequency noise versus temperature over a range of frequencies, for a MOSFET having a phosphorus-doped substrate.

FIG. 3 is a graph of the input referred noise of a conventional MOSFET as a function of temperature, and at several spot frequencies of 10 Hz, 100 Hz, 1 KHz, and 10 KHz. The substrate is doped with phosphorus, having an ionization energy in silicon of about 0.045 eV. For this conventional MOSFET having a phosphorus-doped substrate, strong noise peaks are observed below 40K.

Figure 4:
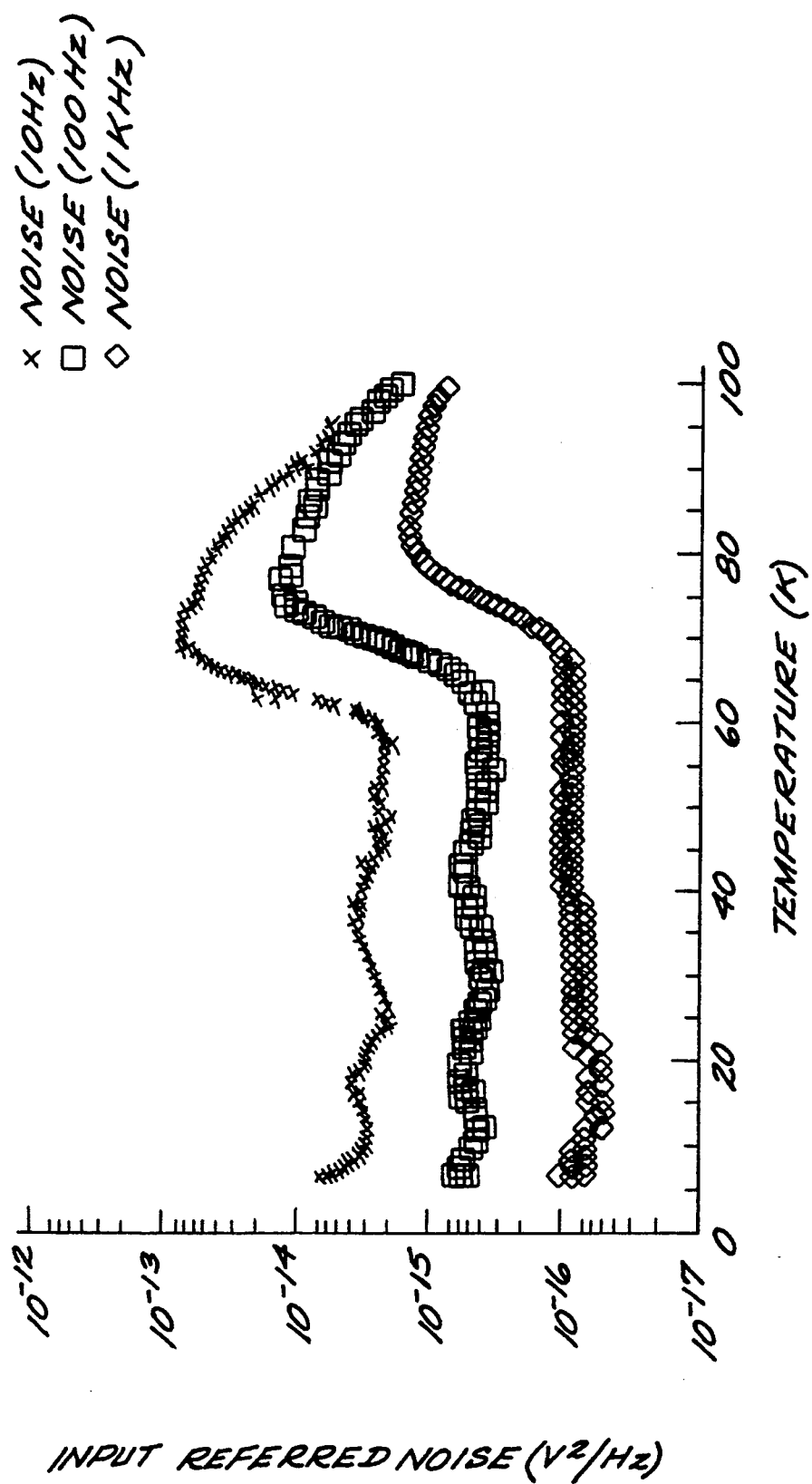
FIG. 4 is a graph of input referred spot frequency noise versus temperature over a range of frequencies, for a MOSFET having a tellurium-doped substrate.

FIG. 4 is a comparable graph for a MOSFET according to the present invention, having a tellurium-doped substrate. Tellurium has an ionization energy in silicon of about 0.14 eV. In this case, the lowest-temperature noise peaks are shifted to temperatures above 40K.

By interpolation, it is determined that the ionization energy of the dopant in the substrate must be at least about 0.1 eV in order to shift the noise peaks from temperatures less than 40K. to a temperature greater than 40K. When the MOSFET of the invention is operated in the temperature range below about 40K., it does not experience the same magnitude of noise previously encountered in prior MOSFETs when operated in that range.

This shifting of the noise peaks is observed over a broad range of frequencies. FIGS. 3 and 4 presents three sets of comparative data for the phosphorus-doped and the tellurium-doped MOSFETs. Data is shown for a range of frequencies from 10 Hz to 1 KHz. At all frequencies measured, the mean-squared noise for the tellurium-doped MOSFET is less than the mean-squared noise for the phosphorus-doped MOSFET, in the range of temperatures below 40K. Below about 20K., the peaks exhibited by the phosphorus-doped MOSFET as shown in FIG. 3 result in much greater mean-squared noise values than the tellurium-doped MOSFET of FIG. 4.

To shift the lowest noise peak of the MOSFET above 40K., the ionization energy of the dopant in the substrate must be more than about 0.1 eV. Many elements exhibit more than one ionization energy, and in these cases both of the ionization energies must be more than about 0.1 eV. Since the ionization energy is a characteristic of the dopant in the substrate material, it is possible to identify dopants that are operable to achieve the required shifting of the noise peak. Operable n-type dopants include the preferred tellurium (Te), having ionization energies in silicon of 0.14 and 0.39 eV, as well as sulfur (S), having ionization energies in silicon of 0.26 and 0.48 eV, tantalum (Ta), having ionization energies in silicon of 0.14 and 0.43 eV, and selenium (Se), having ionization energies in silicon of 0.25 and 0.4 eV. Operable p-type dopants include the preferred indium (In), having an ionization energy in silicon of 0.16 eV, as well as beryllium (Be), having an ionization energy in silicon of 0.17 and 0.42 eV.

The substrate must be as free as possible of contaminant species that produce noise peaks below about 40K. That is, the substrate must have a sufficiently low concentration of contaminants having an ionization energy of less than about 0.1 eV that these contaminants cannot produce significant deionization noise in the sub-40K. temperature range. Preferably, there would be no contaminants present having an ionization energy in the silicon of less than about 0.1 eV. As a practical matter, however, completely eliminating such contaminants is not possible, and it is therefore necessary to determine a practically acceptable contaminant level. Studies have shown that, in most cases, if the concentration of such contaminants having an ionization energy of less than about 0.1 eV is less than about $10^{12}$ per cubic centimeter, the resulting noise below about 40K. is acceptably low.

Figure 5:
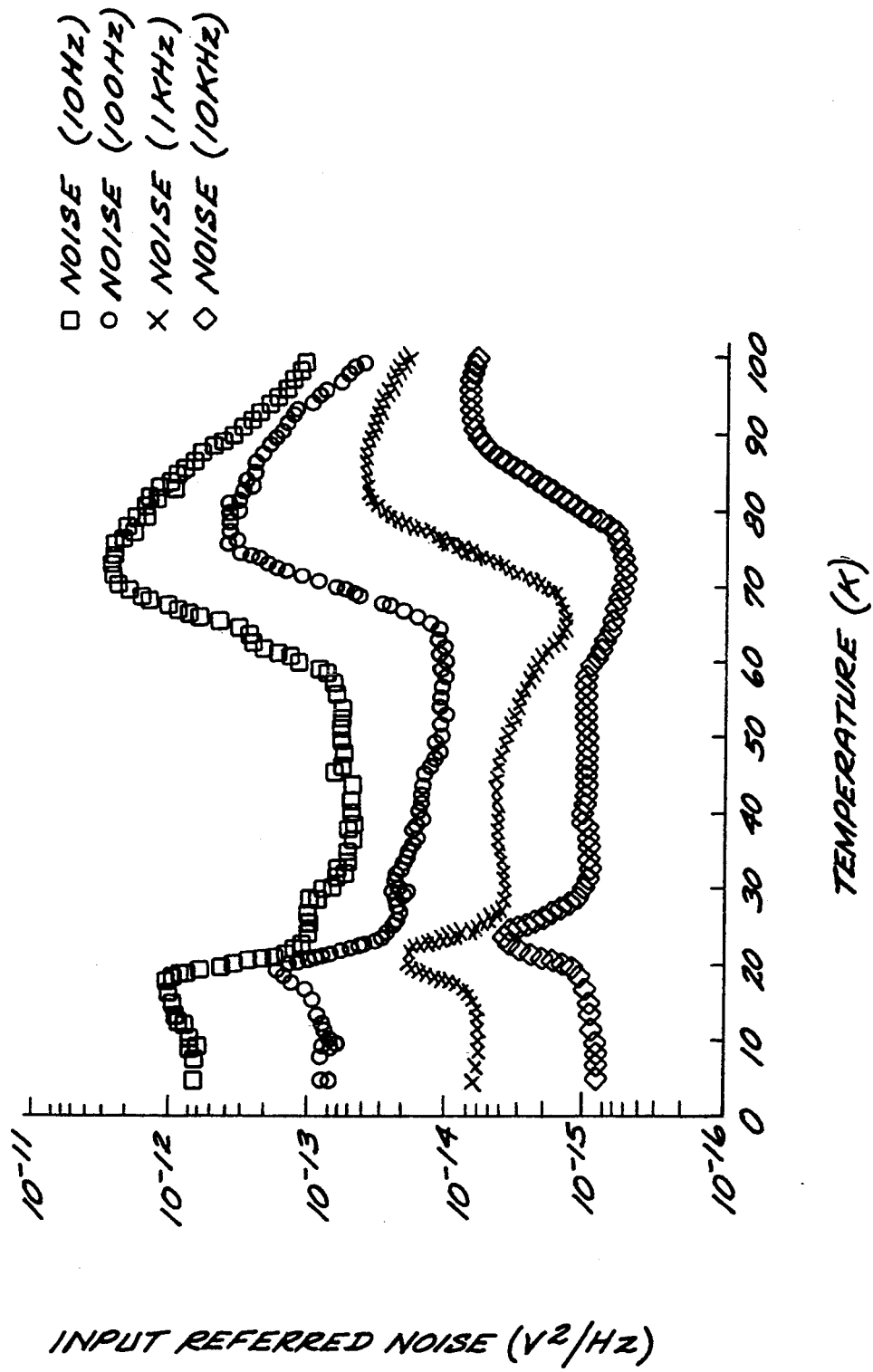
FIG. 5 is a graph of input referred spot frequency noise versus temperature over a range of frequencies, for a MOSFET having a tellurium dopant and an arsenic contaminant.

FIG. 5 illustrates a typical graph of input referred noise as a function of temperature for a MOSFET having both a desirable dopant and an undesirable contaminant, for frequencies ranging from 10 Hz to 10 KHz. The dopant is tellurium in a concentration of about $5 \times 10^{15}$ per cubic centimeter, and the contaminant is arsenic (having an ionization energy in silicon of 0.054 eV) in a concentration of about $3 \times 10^{13}$ per cubic centimeter. At each frequency, there is a noise peak at temperatures below 40K., due to the presence of the arsenic contaminant, and a noise peak at higher temperatures due to the presence of the tellurium dopant. If the arsenic were not present, the low-temperature noise peak would not be observed.

The dopant concentrations may be varied over a range of values. The substrate dopant typically has a concentration of from about $10^{13}$ per cubic centimeter to about $10^{17}$ per cubic centimeter. The source and drain dopants typically have a concentration of from about $10^{19}$ per cubic centimeter to about $10^{20}$ per cubic centimeter.

MOSFETs according to the present invention have been fabricated for both n-type and p-type substrate dopants, in the geometries shown in FIGS. 1 and 2, respectively. To fabricate the MOSFET based upon the n-type substrate, a silicon wafer was doped with tellurium at $5 \times 10^{15}$ per cubic centimeter. The wafer was oxidized to form a 200 Angstrom gate oxide, and a polysilicon layer was deposited over the oxide gate. The gate areas were masked to protect them while the remainder of the polysilicon was etched away. Boron was implanted in a heavy dose to form the source and drain regions. A standard metallization process was used to form the source drain and gate interconnect metal lines. The MOSFET based upon the p-type substrate was prepared in a similar manner, except that the silicon wafer substrate was doped with indium at $5 \times 10^{15}$ per cubic centimeter. Phosphorus was used as the source and drain implant in this case. The remaining steps were identical. Conventional MOSFETs using an n-type phosphorus-doped substrate and a p-type boron-doped substrate were prepared by similar techniques, for comparison purposes.

The MOSFET built on the phosphorus-doped substrate was used in the testing that produced the results of FIG. 3. The MOSFET built on the tellurium-doped substrate was used in the testing that produced the results of FIG. 4. Comparable results were obtained for the MOSFETs prepared using an indium-doped substrate and the conventional boron-doped substrate.

The MOSFETs prepared by the present approach may be used at all temperatures, but are most beneficially used at temperatures less than 40K. where the low-temperature noise peaks have been removed by the deionization noise engineering approach of the invention. In these applications, the MOSFET is usually constructed as an integral part of a readout integrated circuit with sensors or other devices that are operating at such low temperatures. The device and MOSFET(s) are cooled to a temperature of less than 40K. by conventional techniques. A current flows between the source and the drain. The output voltage of a sensor element is applied to the gate, to modulate the current flow between the source and the drain. The inherent noise of the MOSFET according to the invention is much less than in the case of conventional MOSFET devices in the low-temperature range, as shown in FIGS. 3 and 4.

The present invention provides an advance in the art of semiconductor devices, and particularly for MOSFET devices operated below 40K. Although a particular embodiment of the invention has been described in detail for purposes of illustration, various modifications may be made without departing from the spirit and scope of the invention. Accordingly, the invention is not to be limited except as by the appended claims.

What is claimed is:

1. A microelectronic device, comprising:
 a doped silicon substrate wafer, the dopant comprising an element having an ionization energy in the substrate of more than about 0.1 eV, there being no contaminant element having an ionization energy of less than about 0.1 eV in the substrate present in a concentration of more than about $10^{12}$ per cubic centimeter; and
 a metal-oxide-semiconductor field effect transistor in the substrate wafer including
  a source,
  a drain, and
  a gate intermediate the source and the drain.

2. The device of claim 1, wherein the dopant concentration is from about $10^{13}$ per cubic centimeter to about $10^{17}$ per cubic centimeter.

3. The device of claim 1, wherein the substrate dopant is indium.

4. The device of claim 1, wherein the substrate dopant is tellurium.

5. The device of claim 1, wherein the substrate dopant is selected from the group consisting of sulfur, tantalum, selenium, and beryllium.

6. The device of claim 1, wherein the source and drain are p-doped silicon.

7. The device of claim 1, wherein the source and drain are n-doped silicon.

8. The device of claim 1, wherein the gate comprises
 a dielectric layer on the surface of the substrate wafer, and
 a layer of an electrical conductor on the surface of the dielectric layer.

9. A microelectronic device, comprising:
 a doped silicon substrate wafer, the dopant consisting of an element selected from the group consisting of tellurium, indium, sulfur, tantalum, selenium, and beryllium, there being no contaminant having an ionization energy of less than about 0.1 eV in the substrate present in a concentration of more than $10^{12}$ per cubic centimeter; and
 a MOSFET structure embedded in the substrate wafer, the MOSFET structure including
  a source,
  a drain, and
  a gate intermediate the source and the drain.

10. The device of claim 1, wherein the dopant concentration is from about $10^{13}$ per cubic centimeter to about $10^{17}$ per cubic centimeter.

11. The device of claim 9, wherein the source and drain are p-doped silicon, and the substrate wafer dopant is tellurium.

12. The device of claim 9, wherein the source and drain are n-doped silicon, and the substrate wafer dopant is indium.

13. A method for controlling current flows at cryogenic temperatures of less than about 40K., comprising the steps of:
 furnishing a MOSFET device comprising
  a doped silicon substrate wafer, the dopant comprising an element having an ionization energy in the substrate of more than about 0.1 eV, there being no contaminant present in the substrate wafer having an ionization energy of less than about 0.1 eV in the substrate in a concentration of more than about $10^{12}$ per cubic centimeter, and
  a current controlling structure in the substrate wafer including
   a source,
   a drain, and
   a gate intermediate the source and the drain;
 cooling the MOSFET device to a temperature of less than about 40K.; and
 passing a current flow between the source and the drain of the MOSFET device, and controlling the current flow by applying a voltage to the gate.

14. The method of claim 13, wherein the dopant concentration is from about $10^{13}$ per cubic centimeter to about $10^{17}$ per cubic centimeter.

15. The method of claim 13, wherein the substrate dopant is indium.

16. The method of claim 13, wherein the substrate dopant is tellurium.

17. A method for controlling current flows at cryogenic temperatures of less than about 40K., comprising the steps of:

furnishing a MOSFET device comprising
    a doped silicon substrate wafer, the substrate dopant selected from the group consisting of sulfur, tantalum, selenium, and beryllium, and
    a current controlling structure in the substrate wafer including
        a source,
        a drain, and
        a gate intermediate the source and the drain;

cooling the MOSFET device to a temperature of less than about 40K.; and passing a current flow between the source and the drain of the MOSFET device, and controlling the current flow by applying a voltage to the gate.

18. The method of claim 13, wherein the source and drain are p-doped silicon.

19. The method of claim 13, wherein the source and drain are n-doped silicon.

20. A microelectronic device as in claim 1 wherein said device is at a temperature of less than about 40K.

* * * * *